US008804947B2

(12) United States Patent
Rosenblatt et al.

(10) Patent No.: US 8,804,947 B2
(45) Date of Patent: Aug. 12, 2014

(54) DUAL-PURPOSE HARDWARE APERTURE

(71) Applicant: Apple Inc., Cupertino, CA (US)

(72) Inventors: Michael N. Rosenblatt, Campbell, CA (US); Michael M. Lee, San Jose, CA (US); Justin L. Gregg, Golden, CO (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/062,267

(22) Filed: Oct. 24, 2013

(65) Prior Publication Data

US 2014/0055660 A1 Feb. 27, 2014

Related U.S. Application Data

(62) Division of application No. 13/230,709, filed on Sep. 12, 2011, now Pat. No. 8,571,205, which is a division of application No. 12/016,584, filed on Jan. 18, 2008, now Pat. No. 8,031,864.

(51) Int. Cl.
*H04N 5/225* (2006.01)
*H04M 1/00* (2006.01)

(52) U.S. Cl.
USPC .............. 379/433.02; 379/433.03; 348/222.1; 381/334

(58) Field of Classification Search
CPC .. H04M 1/035; H04M 1/0264; H05K 5/0217; H05N 5/225; H04R 3/00; H01R 13/02
USPC ......... 381/355, 356, 361, 387, 394, 332, 334; 455/575.1, 90.3, 556.1, 556.2, 557; 379/419, 428.01, 433.01–433.03; 348/222.1, 231.4
See application file for complete search history.

(56) References Cited

U.S. PATENT DOCUMENTS

| 5,627,901 | A | 5/1997 | Josephson |
| 7,252,549 | B2 | 8/2007 | Nishio et al. |
| 7,536,211 | B2 | 5/2009 | Saiki et al. |
| 7,840,740 | B2 | 11/2010 | Minoo |
| 2002/0112112 | A1* | 8/2002 | Yoshida .......................... 711/1 |

FOREIGN PATENT DOCUMENTS

| CN | 1922849 | 2/2007 |
| EP | 0840396 | 5/1998 |
| EP | 1128489 | 8/2001 |
| JP | 2006292882 | 10/2006 |
| WO | WO0076181 | 12/2000 |

* cited by examiner

*Primary Examiner* — Tuan D Nguyen
(74) *Attorney, Agent, or Firm* — Brownstein Hyatt Farber Schreck, LLP

(57) ABSTRACT

Some embodiments of the present invention provide a system which supports a dual-purpose aperture for an electronic device. This system includes a first component configured to perform an acoustic function through the aperture and a second component configured to perform a non-acoustic function through the aperture.

8 Claims, 9 Drawing Sheets

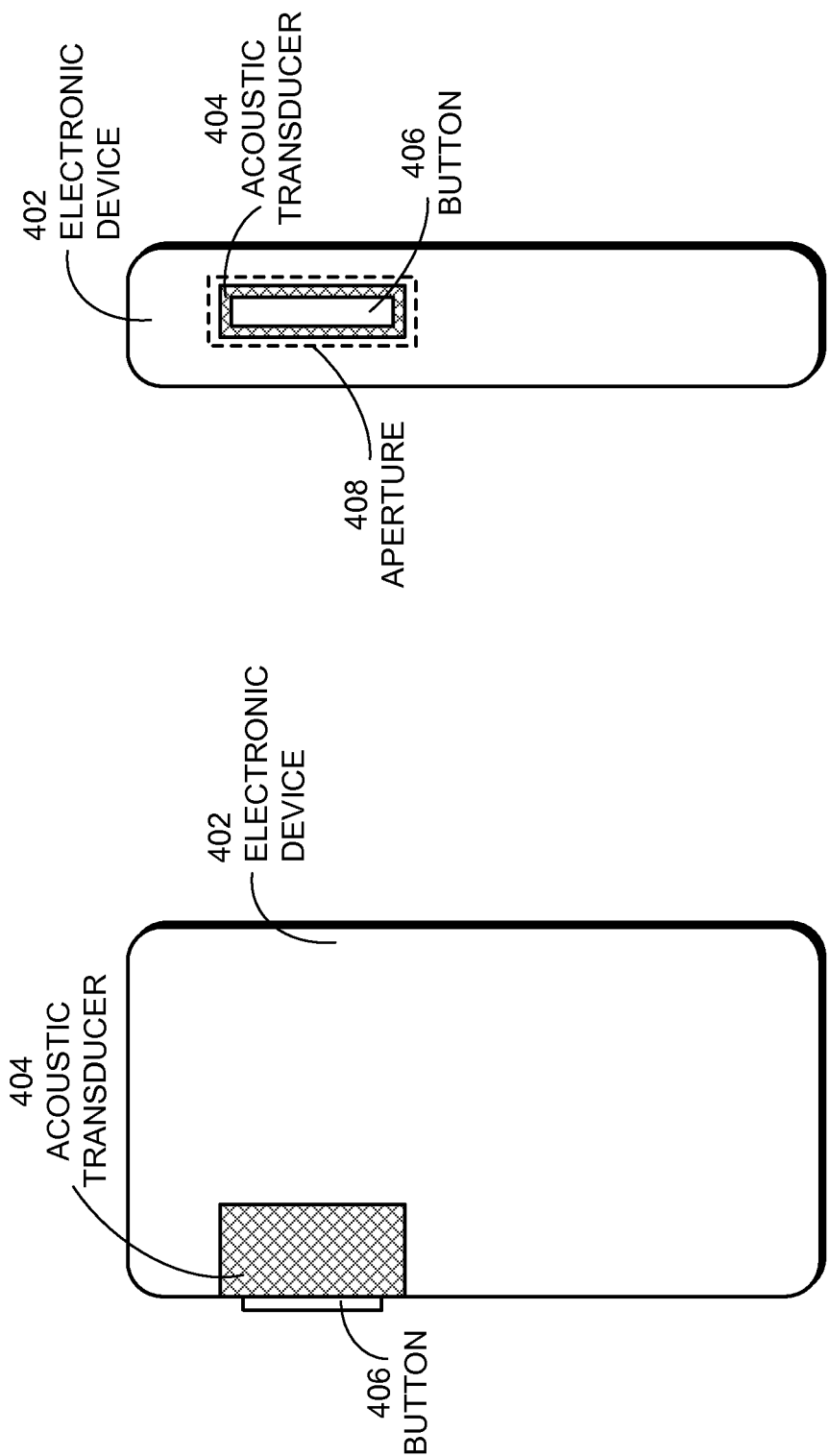

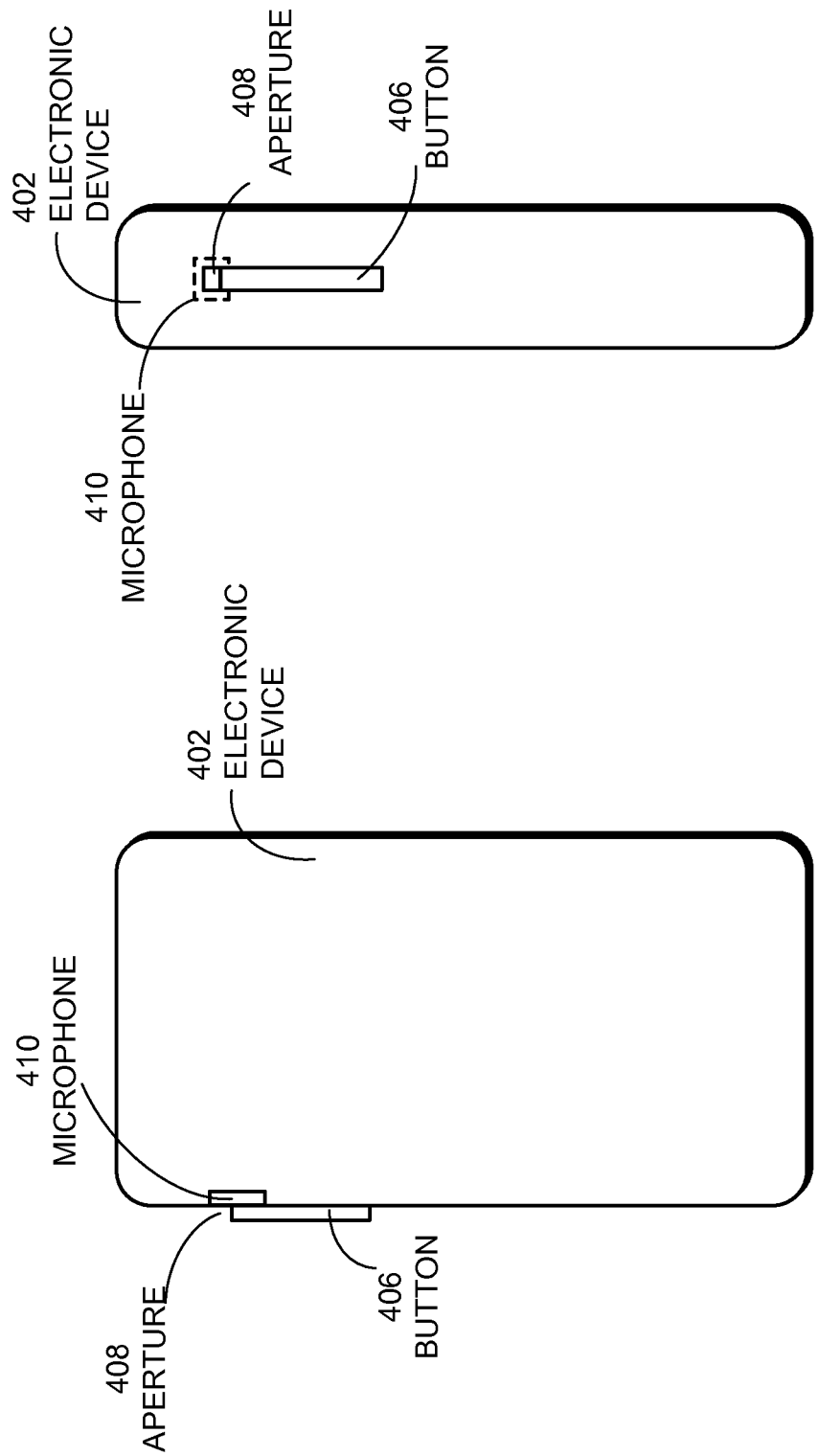

DUAL-PURPOSE HARDWARE APERTURE

CROS-REFERENCES TO RELATED APPLICATIONS

This application is a divisional patent application of U.S. patent application Ser. No. 13/230,709, filed Sep. 12, 2011 and titled "Dual-Purpose Hardware Aperture," now U.S. Pat. No. 8,571,205, which is a divisional patent application of U.S. patent application Ser. No. 12/016,584, filed Jan. 18, 2008 and titled "Dual Purpose Hardware Aperture," now U.S. Pat. No. 8,031,864, the disclousures of which are hereby incorporated by reference herein in their entireties.

BACKGROUND

1. Field

The present invention generally relates to portable electronic devices. More specifically, the present invention relates to the design of a dual-purpose hardware aperture on a portable electronic device.

2. Related Art

The capabilities of portable electronic devices, such as mobile phones, personal digital assistants (PDAs), portable computers, and portable media players, have increased dramatically. These increased capabilities enable modern portable devices to support a wide variety of applications and to store large amounts of documents, media, and/or other files in various formats. For example, a single portable device may function as a mobile phone, a web browser, a portable media player, an email client, a document editor, and a global positioning system (GPS) based navigation system. Similarly, portable computers such as tablet personal computers (PCs) may incorporate the functionalities of full operating systems and application suites in a compact form factor.

The increased capabilities of portable electronic devices are made possible by specific hardware components, such as a high-speed processor, a large memory, a high-resolution display screen, multiple wireless transceivers, multiple input/output (I/O) devices, and/or multiple sensors. To accommodate the various hardware components, the portable device may include multiple physical apertures. For example, the portable device may include apertures for a camera lens, one or more speaker ports, a microphone, a headphone jack, electrical connectors, input devices (e.g., buttons, touchpad, keyboard, pointing stick, trackball, etc.), card slots, and/or electrical ports. However, each of these apertures creates a potential point of failure in the portable device, which lowers the overall reliability of the portable device. Consequently, portable devices may be improved by reducing the number of apertures required to accommodate the various hardware components.

SUMMARY

Some embodiments of the present invention provide a system which supports a dual-purpose aperture for an electronic device. This system includes a first component configured to perform an acoustic function through the aperture and a second component configured to perform a non-acoustic function through the aperture.

In some embodiments, the first component can be a microphone or a speaker.

In some embodiments, the speaker is a piezoelectric speaker.

In some embodiments, the piezoelectric speaker is implemented as a surface-mounted component.

In some embodiments, the surface-mounted component includes an overhang to make space for additional components in the electronic device.

In some embodiments, the piezoelectric speaker can be a front-firing speaker or a side-firing speaker.

In some embodiments, the second component can be an electrical connector, a button, a switch, a card slot, a port, a headphone jack, a camera or a dock.

In some embodiments, the electrical connector is a 30-pin connector.

BRIEF DESCRIPTION OF THE FIGURES

FIGS. 4A-4D show electronic devices with dual-purpose apertures in accordance with an embodiment of the present invention.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Embodiments of the present invention provide a method and system for creating and using multi-purpose hardware apertures. These multi-purpose hardware apertures may be used in electronic devices such as computers, media players, mobile phones, and/or personal digital assistants (PDAs). In addition, the electronic devices may be portable devices, such as laptop computers, cell phones or PDAs.

More specifically, embodiments of the present invention provide a method and system for creating and using multi-purpose apertures on electronic devices. Each aperture includes an acoustic component and a non-acoustic component. The acoustic component may include a microphone or a speaker, and the non-acoustic component may include an electrical connector, a button, a switch, a card slot, a port, a headphone jack, a camera or a dock. Both the acoustic component and the non-acoustic component may be configured to operate through the aperture.

In one or more embodiments of the present invention, the aperture includes an electrical connector and an acoustic transducer. In one or more embodiments of the invention, the acoustic transducer is a piezoelectric speaker that is positioned parallel to the connector tongue. The piezoelectric speaker may be a front-firing speaker or a side-firing speaker. Moreover, the electrical connector may also be implemented as a surface-mounted component with an overhang for the piezoelectric speaker. In one or more embodiments of the present invention, the electrical connector is a 30-pin connector.

Figure 1:
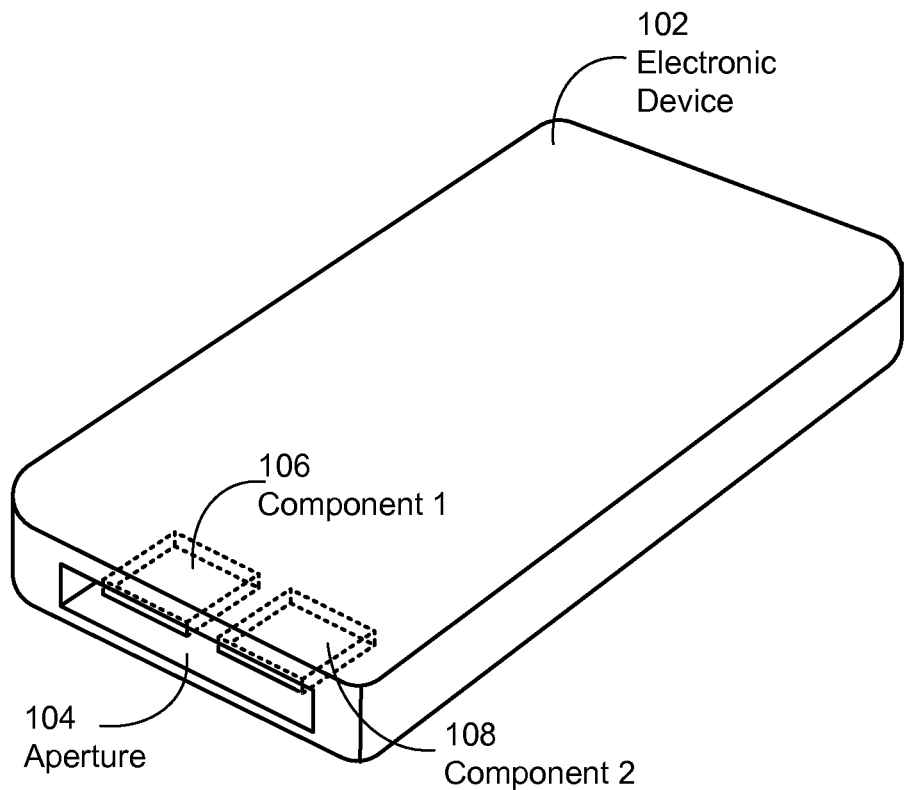
FIG. 1 shows a schematic of an electronic device in accordance with an embodiment of the present invention.

FIG. 1 shows a schematic of an electronic device in accordance with an embodiment of the present invention. Electronic device 102 may correspond to a non-portable electronic device, such as a television, stereo amplifier, desktop computer, and/or workstation. On the other hand, electronic device 102 may correspond to a portable electronic device, such as a mobile phone, portable computer, global positioning system (GPS) receiver, portable media player, and/or graphing calculator.

In one or more embodiments of the present invention, electronic device 102 provides one or more services or functions to a user. Electronic device 102 may also provide the services or functions by receiving input from one or more sources, processing the input, and providing output corresponding to the services or functions performed. For example, a computer may receive input using one or more input devices (e.g., keyboard, mouse, speech recognition, etc.), process the input using a processor and one or more software applications, and provide output using one or more output devices (e.g., display screen, speakers, network connection, etc.). Similarly, a portable music player may receive music files via a connector, port, and/or wireless transceiver, process the music files to generate electric signals corresponding to acoustic waveforms, and generate the acoustic waveforms by driving a set of headphones and/or a speaker using the electric signals.

To facilitate the input functions, processing functions, and output functions performed by electronic device 102, electronic device may include one or more physical components (e.g., component 1 106, component 2 108). Electronic device 102 may also contain one or more apertures (e.g., aperture 104) through which the components operate. For example, electronic device 102 may include an aperture for an electrical connector which connects electronic device 102 to a power source, another electronic device, and/or a data source (e.g., network cable). Electronic device 102 may also include apertures for other components, such as microphones, speakers, headphone jacks, buttons, switches, card slots, ports, cameras, and docks.

Those skilled in the art will appreciate that the functionality of electronic device 102 may be increased by adding components to electronic device 102. For example, to support more sophisticated input/output (I/O) methods, audio recording and playback, still and video images, and/or other features, a portable device may include physical components (e.g., touchscreen, microphone, speaker, headphone jack, camera, etc.) that provide such features to the user. In addition, many of the physical components may operate through apertures on the portable device. For example, a camera may use an aperture for the lens, a microphone or speaker may operate through one or more apertures for acoustic ports, and buttons may be depressed through apertures in the body of the portable device.

Those skilled in the art will also appreciate that each aperture in electronic device 102 corresponds to a mechanical and/or electrical point of failure in electronic device 102. Each additional point of failure may further reduce the overall reliability of electronic device 102. Consequently, implementation of increased functionality with multiple components and apertures may inadvertently lead to reliability issues with electronic device 102.

As shown in FIG. 1, electronic device 102 includes one aperture 104 with two components (e.g., component 1 106, component 2 108). In one or more embodiments of the invention, both components are configured to operate through aperture 104. In one or more embodiments of the invention, component 1 106 performs an acoustic function, and component 2 108 performs a non-acoustic function. Because multiple components operate through a single aperture, electronic device 102 may be less cramped and/or crowded and more reliable.

In one or more embodiments of the invention, component 1 106 can be a microphone or a speaker. In other words, component 1 106 is an acoustic transducer and may use aperture 104 as an acoustic port. In one or more embodiments of the invention, component 2 108 can be an electrical connector, a button, a switch, a card slot, a port, a headphone jack, a camera or a dock. Unlike component 1 106, component 2 108 may use aperture 104 for mechanical and/or electrical purposes, such as receiving a complementary component (e.g., headphone, port, etc.) or performing a mechanical action (e.g., pressing a button, moving a switch, etc.). In one or more embodiments of the invention, component 1 106 and component 2 108 are arranged around aperture 104 such that both components operate through aperture 104, as described below with respect to FIGS. 2-6.

Figure 2A:
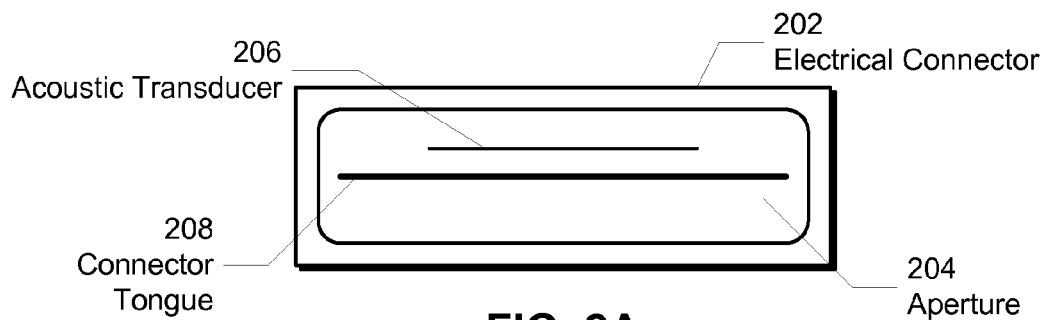
FIGS. 2A-2F show electrical connectors in accordance with an embodiment of the present invention.

FIG. 2A shows a bottom view of an electrical connector in accordance with an embodiment of the present invention. Electrical connector 202 includes an aperture 204, an acoustic transducer 206, and a connector tongue 208. As described above, both electrical connector 202 and acoustic transducer 206 may operate through aperture 204. For example, electrical connector 202 may mate with a corresponding electrical component using aperture 204, and acoustic transducer 206 may project and/or detect sound through aperture 204.

Electrical connector 202 may also use connector tongue 208 to mate with the corresponding electrical component. Connector tongue 208 may include one or more contact points that allow electrical connector 202 to transmit and/or receive electric signals to and/or from the corresponding electrical component. In one or more embodiments of the invention, the corresponding electrical component is a complementary connector, a port, or a dock. In one or more embodiments of the invention, electrical connector 202 is a 30-pin connector. In one or more embodiments of the invention, acoustic transducer 206 can be a microphone or a speaker. Furthermore, acoustic transducer 206 may be a piezoelectric speaker, as described below with respect to FIGS. 2C-2E.

Figure 2B:
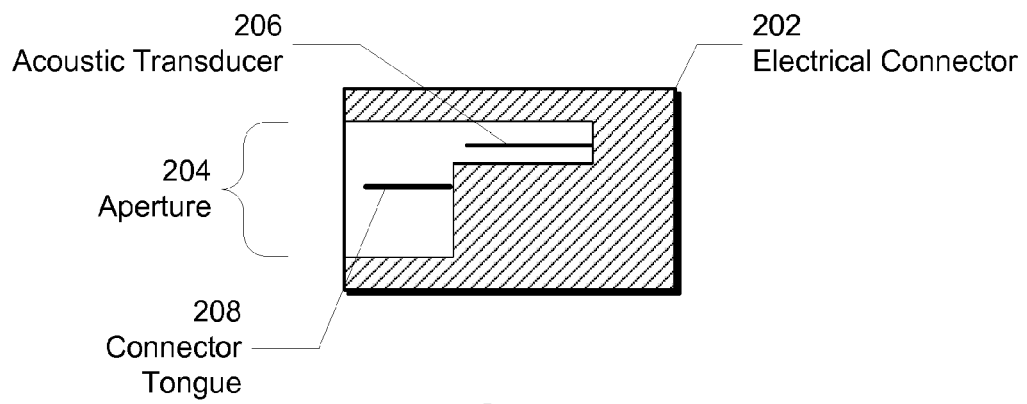

FIG. 2B shows a sectional side view of an electrical connector in accordance with an embodiment of the present invention. As shown in FIG. 2B, both acoustic transducer 206 and connector tongue 208 are placed within aperture 204. Further, both acoustic transducer 206 and electric connector 202 operate through aperture 204. In one or more embodiments of the invention, aperture 204 is used by electrical connector 202 when electrical connector 202 is mated with an electrical component. However, when aperture 204 is not obscured by the electrical component, acoustic transducer 206 may use aperture 204 to perform an acoustic function.

For example, if acoustic transducer 206 is a microphone, acoustic transducer 206 may detect and/or sample sound through aperture 204. On the other hand, if acoustic transducer 206 is a speaker, acoustic transducer 206 may project sound through aperture 204. In other words, aperture 204 and connector tongue 208 may provide a mating mechanism for electrical connector 202, and aperture 204 may provide an acoustic port for acoustic transducer 206.

As shown in FIG. 2B, acoustic transducer 206 may be positioned parallel to connector tongue 208. This parallel configuration may allow space to be saved within aperture 204 and the components within to operate without interfering with one another. For example, acoustic transducer 206 may be positioned to avoid damage when electrical connector 202 is mated with another electrical component. Similarly, connector tongue 208 may be positioned to allow effective transmission and/or detection of sound from acoustic transducer 206. As described above, acoustic transducer 206 may be a piezoelectric speaker. In one or more embodiments of the invention, the membrane of the piezoelectric speaker is positioned parallel to the major plane of electrical connector 202. In addition, the piezoelectric speaker may be a front-firing speaker or a side-firing speaker. If the piezoelectric speaker is a side-firing speaker, the sound produced by the speaker is projected out of aperture 204. However, if the piezoelectric speaker is a front-firing speaker, the sound produced by the speaker may be projected orthogonally to aperture 204. As a result, electrical connector 202 may include one or more acoustic coupling mechanisms (not shown) for directing sound through aperture 204 when acoustic transducer 206 is a front-firing speaker.

Figure 2C:
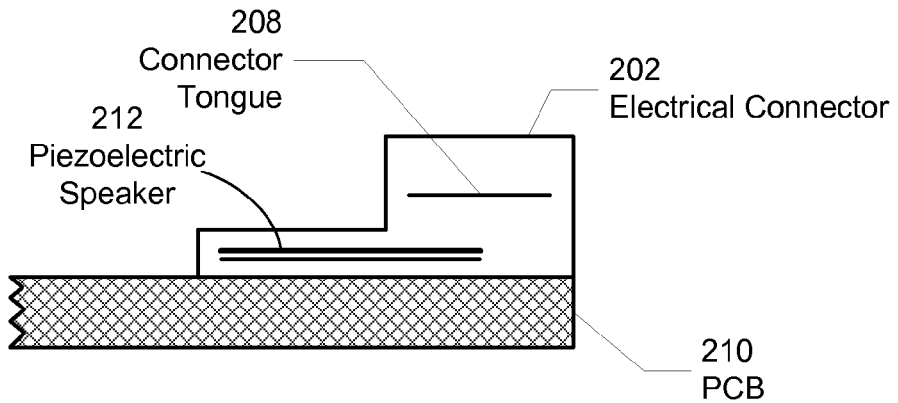

FIG. 2C shows a sectional side view of an electrical connector in accordance with an embodiment of the present invention. Specifically, FIG. 2C shows a sectional view of a dual-purpose electrical connector 202 component on a printed circuit board (PCB) 210. Electrical connector 202 includes a connector tongue 208 and a piezoelectric speaker 212. In one or more embodiments of the invention, piezoelectric speaker 212 corresponds to an acoustic transducer, such as acoustic transducer 206 of FIGS. 2A-2B. In one or more embodiments of the invention, electrical connector 202 is a surface-mounted component on PCB 210. In addition, piezoelectric speaker 212 is integrated into electrical connector 202. As a result, material usage and volumetric utilization are conserved in electrical connector 202, despite the dual functionality provided by electrical connector 202.

As shown in FIG. 2C, piezoelectric speaker 212 is positioned below and in front of connector tongue 208. In addition, the major plane of piezoelectric speaker 212 is parallel to the major plane of electrical connector 202, as mentioned above. Piezoelectric speaker 212 and connector tongue 208 are also arranged such that neither component interferes with the operation of the other component. Similarly, embodiments of the invention may include other functional configurations of connector tongue 208 and piezoelectric speaker 212, as described below with respect to FIGS. 2D-2E.

Figure 2D:
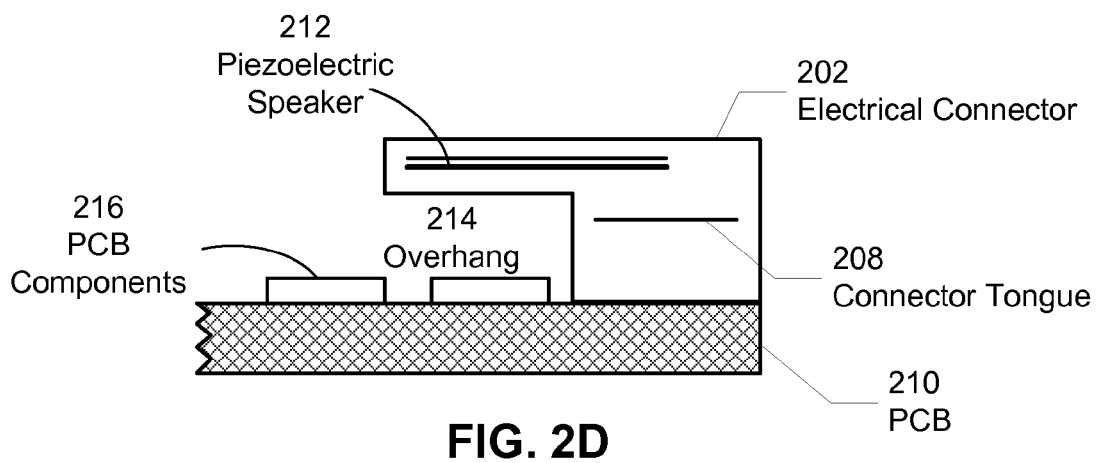

FIG. 2D shows a sectional side view of an electrical connector in accordance with an embodiment of the present invention. Specifically, FIG. 2D shows a sectional view of a dual-purpose electrical connector 202 component with an overhang 214 on a PCB 210. As with FIG. 2C, electrical connector 202 may be implemented as a surface-mounted component on PCB 210. In addition, piezoelectric speaker 212 and connector tongue 208 may be arranged in various parallel configurations with respect to one another.

As shown in FIG. 2D, piezoelectric speaker 212 is positioned above and in front of connector tongue 208 in electrical connector 202. In addition, an overhang 214 is formed by the positioning of piezoelectric speaker 212 within electrical connector 202. Overhang 214 may provide additional space on PCB 210, thus allowing additional PCB components 216 to be placed on PCB 210 underneath piezoelectric speaker 212.

Figure 2E:
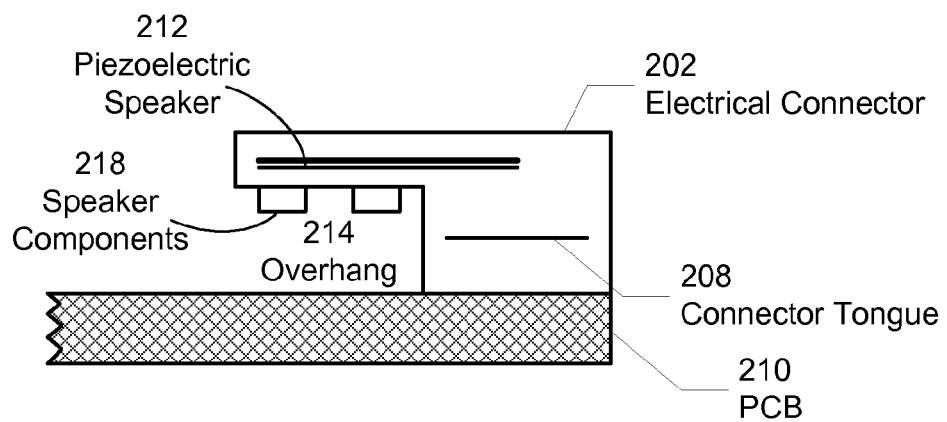

FIG. 2E shows a sectional side view of an electrical connector in accordance with an embodiment of the present invention. As with FIG. 2D, FIG. 2E shows a dual-purpose electrical connector 202 component with an overhang 214 on a PCB 210. However, FIG. 2E illustrates a different use of overhang 214. Instead of placing PCB components onto PCB 210 below overhang 214, speaker components 218 are attached to electrical connector 202 beneath overhang 214. Alternatively, speaker components 218 may be placed on top of electrical connector 202. In one or more embodiments of the invention, speaker components 218 may be used to drive piezoelectric speaker 212. Alternatively, speaker components 218 may include additional speakers with different frequency responses from piezoelectric speaker 212. Those skilled in the art will appreciate that electrical connector 202 and PCB components 216 attached to PCB 210 may be used in the presence of overhang 214.

Figure 2F:
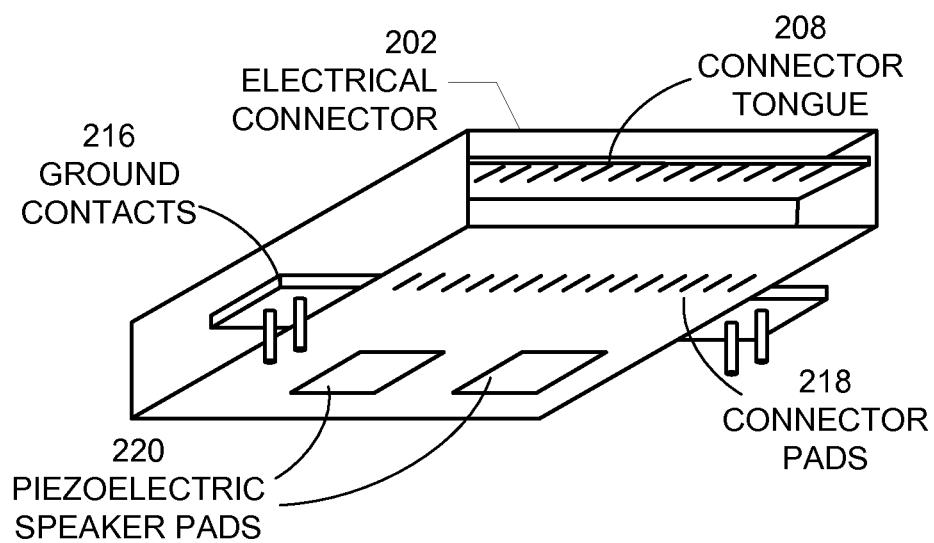

FIG. 2F shows an electrical connector component in accordance with an embodiment of the present invention. Electrical connector 202 includes a connector tongue 208, as described above. Electrical connector 202 may also include connector pads 218 for connecting electrical connector 202 with a PCB, such as PCB 210 of FIGS. 2C-2E. In one or more embodiments of the invention, electrical connector 202 is a 30-pin connector. As a result, connector tongue 208 may include 30 contacts for mating with a 30-pin port, for example. Similarly, electrical connector 202 may include 30 connector pads 218 corresponding to the contacts on connector tongue 208.

Electrical connector 202 may also include piezoelectric speaker pads 220 for electrically connecting a piezoelectric speaker within electrical connector 202 to the PCB. In one or more embodiments of the invention, piezoelectric speaker pads 220 are used to drive the piezoelectric speaker within electrical connector 202. The output of the piezoelectric speaker is directed through an aperture in electrical connector 202, as described above with respect to FIGS. 2A-2E.

Ground contacts 216 may connect electrical connector 202 to a circuit ground on the PCB. Ground contacts 216 may also provide structural support for electrical connector 202. As mentioned above, electrical connector 202 may be a surface-mounted component on the PCB. As a result, electrical connector 202 may lack physical connectors to the PCB from connector pads 218 and piezoelectric speaker pads 220. Instead, electrical connector 202 may use ground contacts 216 as support structures for physically connecting electrical connector 202 to the PCB.

Figure 3:
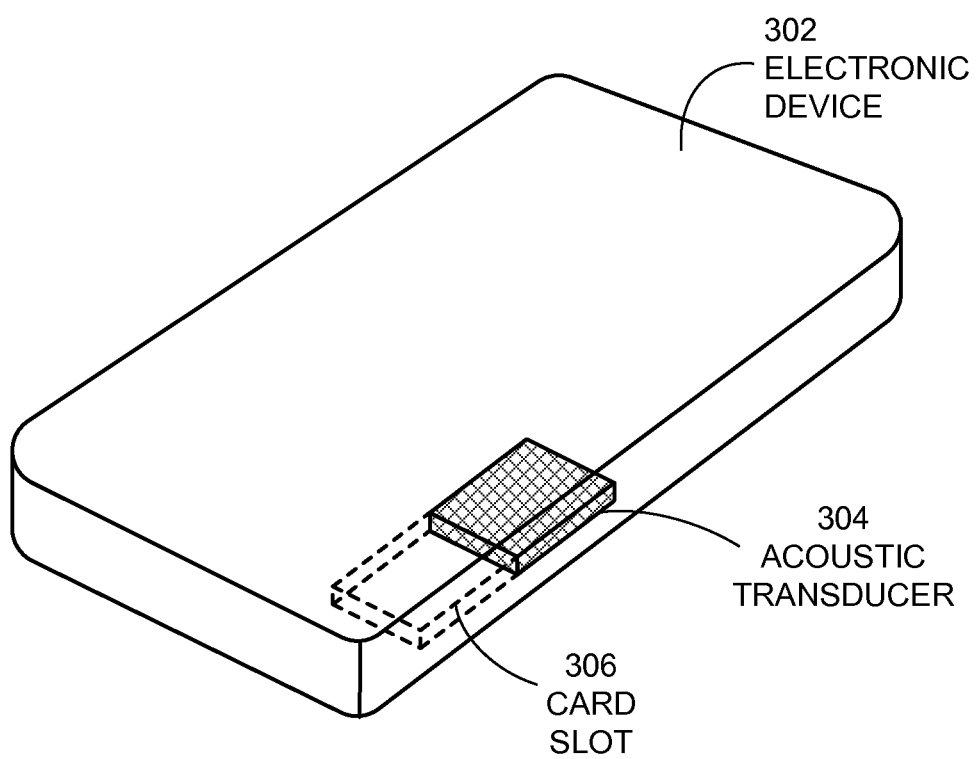
FIG. 3 shows an electronic device with a dual-purpose card slot in accordance with an embodiment of the present invention.

FIG. 3 shows an electronic device in accordance with an embodiment of the present invention. In particular, FIG. 3 shows electronic device 302 with a dual-purpose card slot 306. Card slot 306 may be used to read various types of cards for electronic devices, such as memory cards, wireless cards, smart cards, Personal Computer Memory Card International Association (PCMCIA) cards, and/or Subscriber Identity Module (SIM) cards.

As shown in FIG. 3, electronic device 302 also includes an acoustic transducer 304. In one or more embodiments of the invention, acoustic transducer 304 is configured to operate through card slot 306. In other words, acoustic transducer 304 may be configured to project and/or receive sound through card slot 306. In one or more embodiments of the invention, card slot 306 is used to read an associated card when the card is inserted into card slot 306. When card slot 306 is empty, acoustic transducer 304 may use card slot 306 as an acoustic port. For example, acoustic transducer 304 may play sound through card slot 306 if acoustic transducer 304 is a speaker. Similarly, acoustic transducer 304 may monitor and/or record sound through card slot 306 if acoustic transducer 304 is a microphone.

FIG. 4A shows an electronic device in accordance with an embodiment of the present invention. Specifically, FIG. 4A shows a front view of electronic device 402 with a dual-purpose aperture. In one or more embodiments of the invention, the aperture is used by an acoustic transducer 404 within electronic device 204 and a button 406 on the outside of electronic device 402. In one or more embodiments of the invention, an aperture is formed around button 406, allowing button 406 to be depressed within the aperture. In one or more embodiments of the invention, acoustic transducer 404 is positioned to operate acoustically through the aperture.

Those skilled in the art will appreciate that button 406 may be selected from a variety of touch-sensitive input devices. For example, button 406 may be a mechanical button, a capacitive device, a resistive device, a virtual button, an infrared device, a surface acoustic wave (SAW) device, and/or other type of physical input device. In addition, button 406 may be constructed using a solid material, mesh material (for additional acoustic venting), flexible material, and/or other material.

FIG. 4B shows an electronic device in accordance with an embodiment of the present invention. Specifically, FIG. 4B shows a side view of electronic device 402 with dual-purpose aperture 408. As mentioned above, aperture 408 may be used by button 406 as a mechanical interface, and by acoustic transducer 404 as an acoustic port. As shown in FIG. 4B, aperture 408 is formed around button 406, allowing button 406 to be depressed into aperture 408 if button 406 is a mechanical button. Acoustic transducer 404 may be positioned behind button 406 within electronic device 402 and use aperture 408 to detect and/or project sound.

FIG. 4C shows an electronic device in accordance with an embodiment of the present invention. Specifically, FIG. 4C shows a front view of electronic device 402 with a dual-purpose aperture 408. Aperture 408 is used by button 406 on the outside of electronic device 402 and a microphone 410 within electronic device 402. However, unlike FIGS. 4A-4B, aperture 408 is located at the top of button 406 and may allow microphone 410 to sample sound more directly.

FIG. 4D shows a side view of an electronic device in accordance with an embodiment of the present invention. Specifically, FIG. 4D shows a side view of electronic device 402 with a dual-purpose aperture that is used by button 406 and microphone 410. As shown in FIG. 4D, microphone 410 is located directly behind aperture 408 within electronic device 402. Button 406 is positioned below aperture 408, thus allowing microphone 410 to detect sound via a more direct path. Alternatively, button 406 may be a switch, such as a power switch, that is mechanically moved using aperture 408. For example, button 406 may correspond to a power switch that is in an "off" state when button 406 is pushed upwards and obscures aperture 408. Button 406 may then be shifted down to power electronic device 402 up, thus exposing aperture 408 and allowing microphone 410 to operate through aperture 408.

Figure 5:
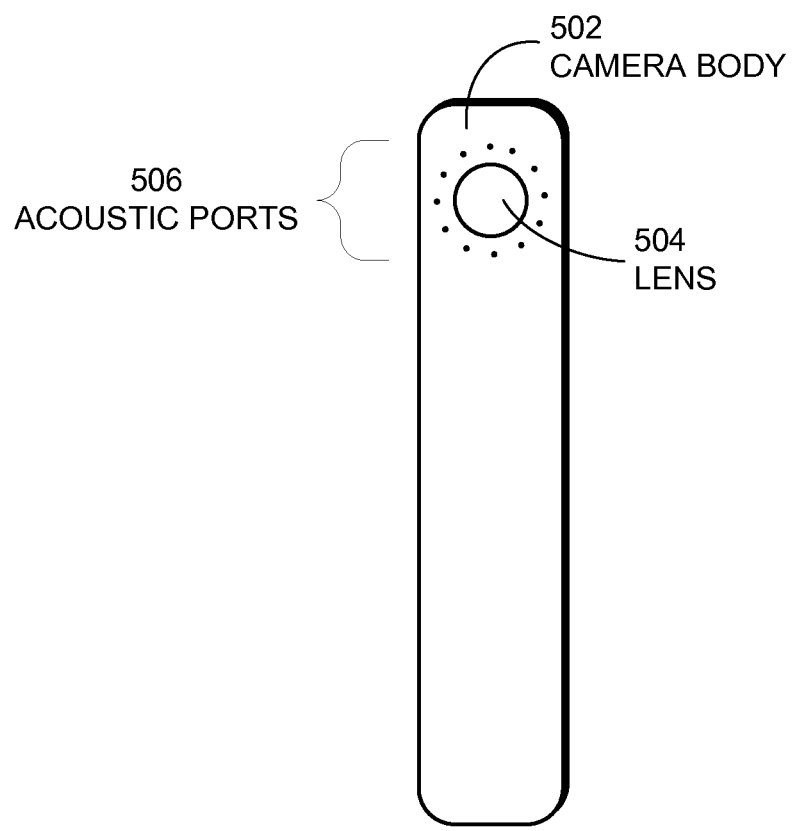
FIG. 5 shows a camera in accordance with an embodiment of the present invention.

FIG. 5 shows a camera in accordance with an embodiment of the present invention. As shown in FIG. 5, the camera includes a camera body 502 and a lens 504. Camera body 502 may also correspond to the body of a portable media device, such as a mobile phone, PDA, audio and/or video player, and/or computer. In one or more embodiments of the invention, lens 504 captures and focuses light from the camera's surroundings onto a recording medium (e.g., film, electronic sensor, etc.) within camera body 502. In addition, lens 504 may also be positioned within an opening in camera body 502.

The camera also includes a set of acoustic ports 506 arranged around the opening for lens 504. In one or more embodiments of the invention, acoustic ports 506 are used by a microphone or speaker within camera body 502. In other words, the microphone or speaker may use acoustic ports 506 to transmit or receive sound. Acoustic ports 506 may also form part of the opening for lens 504. In addition, acoustic ports 506 may be used by a camera flash (not shown) within the camera. As with components described in FIGS. 2-4, the camera flash and microphone or speaker may be arranged within camera body 502 such that neither component interferes with the operation of the other component. For example, the microphone or speaker may be positioned outside of a direct path between the camera flash and the acoustic ports. Likewise, the camera flash may be positioned within camera body 502 to facilitate sound transmission between acoustic ports 506 and the microphone or speaker.

Figure 6:
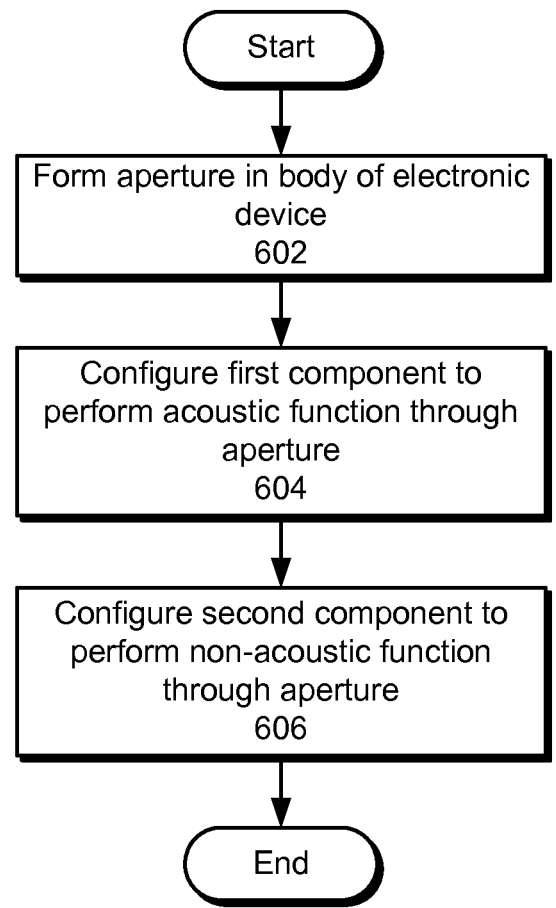
FIG. 6 presents a flow chart illustrating the process of creating an aperture in an electronic device in accordance with an embodiment of the present invention.

FIG. 6 presents a flow chart illustrating the process of creating an aperture in an electronic device in accordance with an embodiment of the present invention. In one or more embodiments of the invention, one or more of the steps may be omitted, repeated, and/or performed in a different order. Accordingly, the specific arrangement of steps shown in FIG. 6 should not be construed as limiting the scope of the invention.

First, an aperture is formed in the body of an electronic device (operation 602). As mentioned previously, the electronic device may be portable (e.g., mobile phone, PDA, portable computer, etc.) or non-portable (e.g., desktop computer, workstation, etc.). Next, a first component is configured to perform an acoustic function through the aperture (operation 604). As described above, the first component may be an acoustic transducer, such as a microphone or a speaker. The first component may also use the aperture as an acoustic port. For example, a microphone may sample sound through the aperture, and a speaker may project sound through the aperture.

Similarly, a second component is configured to perform a non-acoustic function through the aperture (operation 606). As mentioned above, the second component may be selected from a variety of physical components of the electronic device. For example, the second component may be an electrical connector, a button, a switch, a card slot, a port, a headphone jack, a camera or a dock. The second component may be housed within the aperture. For example, a mechanical button may be surrounded by the aperture and depressed within the aperture. A switch may be set to various positions within and/or using the aperture, as described above with respect to FIG. 4. The aperture may also perform a mechanical and/or structural role for the second component. For example, an electrical connector and/or card slot may use the aperture to connect to other components, such as complementary connectors, ports, and/or cards.

The foregoing descriptions of embodiments have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An electronic device, comprising:
   a lens within an opening in a body of the electronic device, wherein the lens directs light onto a recording medium within the electronic device; and
   one or more acoustic ports in the body of the electronic device arranged around the opening for the lens, wherein the one or more acoustic ports form part of the opening for the lens.

2. The electronic device of claim 1, wherein the acoustic ports are used by a speaker or a microphone within the electronic device.

3. The electronic device of claim 2, further comprising a flash, wherein the acoustic ports are further used by the flash.

4. The electronic device of claim 1, wherein the electronic device comprises a camera.

5. The electronic device as in claim 1, wherein the electronic device comprises a portable media player.

6. A method for providing an electronic device, comprising:
   providing a lens within an opening in a body of the electronic device, wherein the lens directs light onto a recording medium within the electronic device; and
   providing the one or more acoustic ports in the body of the electronic device around the opening for the lens, wherein the one or more acoustic ports form part of the opening for the lens.

7. The method as in claim 6, further comprising providing a speaker or a microphone within the electronic device, wherein the acoustic ports are used by the speaker or the microphone.

8. The method as in claim 7, further comprising providing a flash in the body of the electronic device, wherein the acoustic ports are further used by the flash.

* * * * *